United States Patent [19]

Dupree

[11] Patent Number: 5,150,054
[45] Date of Patent: Sep. 22, 1992

[54] NMR-SPECTROMETER WITH SAMPLE EXCHANGER

[75] Inventor: Raymond Dupree, Leamington Spa, United Kingdom

[73] Assignee: Bruker Analytische Meβtechnik GmbH, Fed. Rep. of Germany

[21] Appl. No.: 602,314

[22] PCT Filed: May 20, 1989

[86] PCT No.: PCT/DE89/00324
§ 371 Date: Nov. 21, 1990
§ 102(e) Date: Nov. 21, 1990

[87] PCT Pub. No.: WO89/11646
PCT Pub. Date: Nov. 30, 1989

[30] Foreign Application Priority Data

May 27, 1988 [DE] Fed. Rep. of Germany ....... 3818039

[51] Int. Cl.$^5$ .......................................... G01R 33/20
[52] U.S. Cl. .................................................... 324/318
[58] Field of Search ............... 324/300, 307, 308, 309, 324/318, 319, 321, 322

[56] References Cited

U.S. PATENT DOCUMENTS

| | | |
|---|---|---|
| 4,091,323 | 5/1978 | Landis . |
| 4,581,583 | 4/1986 | Van Vliet et al. . |
| 4,859,948 | 8/1989 | Kuster ................................. 324/318 |
| 4,859,949 | 8/1989 | McKenna ............................ 324/321 |

FOREIGN PATENT DOCUMENTS 0188368 1/1986 European Pat. Off. .
0308654 8/1988 European Pat. Off. .

OTHER PUBLICATIONS

Patent Abstracts of Japan, vol. 11, No. 260 (P-608) (2707) Aug. 22, 1987.

Primary Examiner—Michael J. Tokar
Attorney, Agent, or Firm—Walter A. Hackler

[57] ABSTRACT

In order to take NMR-spectrograms, it is necessary that the spins of the sample be arranged in a homogeneous magnetic field. For that purpose, NMR-spectrometers have a magnet arrangement (2) in the magnetic field of which is arranged a sampling head (5). When the spin-lattice-relaxation time $T_1$ of substances to be examined lies in the range of hours, the spectrometer is unusable for hours due to the necessary prepolarization of the sample. The invention is aimed at solving this problem. A sample magazine (11) is arranged in the magnetic field generated by the magnet arrangement (2). It offers the possibility of exposing a larger number of samples to the magnetic field of the magnet (2) while simultaneously carrying out measurements. Since measurements of samples having long spin-lattice-relaxation times $T_1$ require a considerable time, the capacity of a magazine arranged in the magnetic field is sufficient to ensure a practically continuous operation of the spectrometer, even when samples with long $T_1$ are analysed. The design of the sample magazine (11) as a rotatable drum (21) arranged in the bore (1) of a cryomagnet is particularly appropriate for cryomagnets.

6 Claims, 1 Drawing Sheet

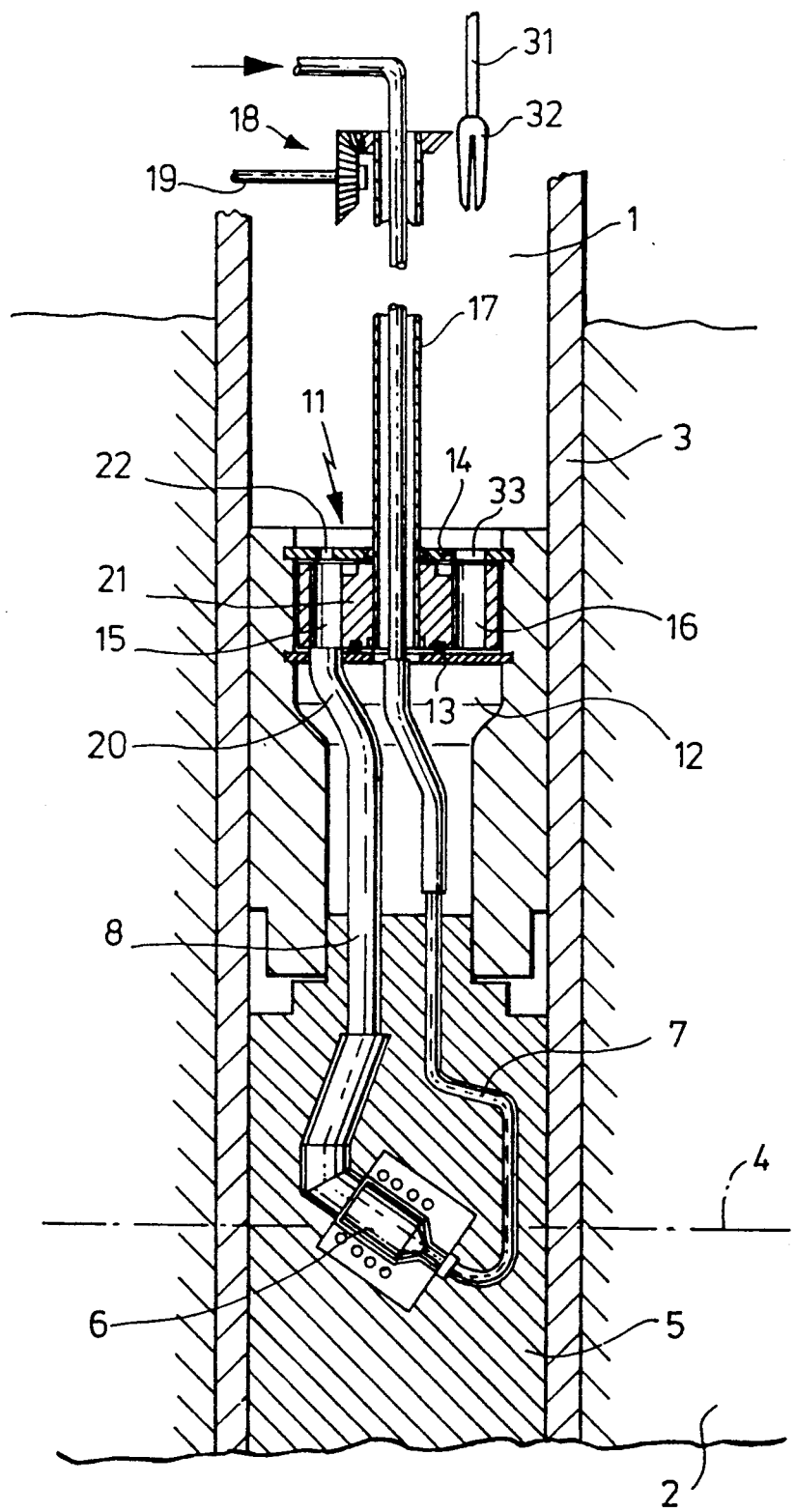

NMR-SPECTROMETER WITH SAMPLE EXCHANGER

BACKGROUND OF THE INVENTION

The invention concerns an NMR-spectrometer with a magnet system that produces a magnetic field which is nearly homogeneous within a specified region, with a sample holder in said homogeneous field region and a sample changer comprising a sample magazine and devices to sequentially transfer one sample at a time from the magazine to the holder and back.

There are many known embodiments of NMR-spectrometers. Some of them include sample changers which allow continuous around-the-clock use, for example the Bruker AM-series NMR spectrometers. Although these sample changers permit automatic collection of spectra in rapid sequence, the time needed for taking one spectrum depends strongly on the spin-lattice relaxation time T1 since this relaxation time determines the time period during which a sample must be prepolarized before it can be excited to take a spectrum. The time necessary for prepolarization is typically $5 \times T1$. Therefore measurements of samples with long relaxation times T1 require particularly long times especially when these relaxation times are several hours. In particular with solid samples T1 is very large whereas the spin-spin-relaxation time T2 is relatively small. Therefore it is not possible to prepolarize the sample in a second magnet with subsequent transfer to the spectrometer magnetic field, since during the transfer the sample would have had to have passed through a region of small and changing magnetic field strengths (the earth's field). As a result, the prepolarization of the sample would have been destroyed (see e.g. R. Dupree and M. E. Smith, JMR 75, 153 (1987) and C. A. Fyfe, Solid State NMR for Chemists, C.F.C. Press, Ontario, Canada 1983).

NMR-spectrometers with a sample changer and sample magazine are known e.g. from U.S. Pat. No. 4,581,583. U.S. Pat. No. 4,654,592 discloses an NMR-spectrometer wherein, within a homogeneous magnetic field region, a stator housing supports separated parallel rotors each containing one sample. Separate RF-coils can be used for each sample or both samples can be inside a common coil. The rotors are the sample holders. There is no provision for a magazine from which the samples can be transferred to and from the sample holder. If a single RF-coil is used the measurement of the different samples takes place necessarily simultaneously. Even when several RF-coils are used simultaneous measurement is also envisioned. U.S. Pat. No. 4,654,592 does not disclose the possibility of prepolarizing the sample in a magnetic field for a long time without performing a measurement and afterwards transferring this sample to the actual measuring region, where the RF-coil is located and the magnetic field is sufficiently homogeneous.

NMR-spectrometers with a sample changer and sample magazine are known e.g. from U.S. Pat. No. 4,581,583. U.S. Pat. No. 4,654,592 discloses an NMR-spectrometer wherein, within a homogeneous magnetic field region, a stator housing supports separated parallel rotors each containing one sample. Separate RF-coils can be used for each sample or both samples can be inside a common coil. The rotors are the sample holders. There is no provision for a magazine from which the samples can be transferred to and from the sample holder. If a single RF-coil is used the measurement of the different samples takes place necessarily simultaneously. Even when several RF-coils are used simultaneous measurement is also envisioned. U.S. Pat. No. 4,654,592 does not disclose the possibility of prepolarizing the sample in a magnetic field for a long time without performing a measurement and afterwards transferring this sample to the actual measuring region, where the RF-coil is located and the magnetic field is sufficiently homogeneous.

SUMMARY OF THE INVENTION

It is the object of the present invention to provide the possibility to measure samples with long spin-lattice relaxation times T1 within time intervals which are short compared to these relaxation times T1 using the above mentioned type of spectrometer.

This object is achieved according to the invention by locating the sample magazine within a space which is provided by the magnetic field produced by the magnet system.

Placing the sample magazine inside the magnetic field produced by the magnet system, allows for a larger number of samples to be prepolarized by the same magnetic field in which the measurement takes place. In this way the time required to measure the samples which are contained in the magazine serves as prepolarization time for subsequent samples and the capacity of the NMR-spectrometer is increased by the number of samples that are in the magazine contained within the magnetic field of the magnet system.

The sample magazine may be designed in a manner similar to the known sample changers. However, a rotatable drum configuration with compartments for a number of samples which are parallel to the axis of rotation is particularly advantageous. Sequential transfer of the samples is effected through rotation of the drum and linking to the transfer mechanism. The main advantage of using such a rotatable drum is that a drum can house a relatively large number of samples within the narrow space inside the magnetic field produced by the magnet system. The use of a drum is particularly advantageous if the NMR-spectrometer includes a cryomagnet. Such a drum may particularly easily be placed at a distance from the region of extreme homogeneity within the bore of the cryomagnet. It may even be integrated into the probehead of such a spectrometer containing the sample holder.

The transfer mechanism can include means to transfer the samples from an external magazine to the magazine located inside the magnetic field allowing also an automatic use over long periods of time. To exchange samples between the inner and the outer magazine standard grasping mechanisms can be used. In particular the mechanism to transfer the sample from the inner magazine to the sample holder may include pneumatic conduits whereby the samples are carried by air pressure and are selectively raised and lowered to and from the magazine and probehead by adjusting the air pressure. Samples can be mechanically transferred from an external magazine to a transfer point and pneumatic devices can then be utilized to move the samples from this transfer point to and from the inner magazine.

Other details and embodiments of the invention will be apparent from the following description of the embodiment shown in the drawing. The features that can be derived from the specification and the drawing may be incorporated in other embodiments of the invention either individually or in any combination thereof.

BRIEF DESCRIPTION OF THE DRAWING

The FIGURE shows a schematic cross section through the magnet system of an NMR-spectrometer according to the invention.

DESCRIPTION OF THE PREFERRED EMBODIMENTS

In the example shown a shim system 3 is located inside the vertical bore 1 of a cryomagnet 2 which is sketched only schematically. The shim system is designed in such a way as to effect a highly uniform magnetic field within a region of bore 1 which region extends symmetrically to both sides of a plane 4 perpendicular to bore 1. Also schematically indicated, is probehead 5 which is inserted in bore 1 of the cryomagnet. The probehead 5 contains a holder 6 for the sample to be measured within the extremely homogeneous magnetic field region extending to both sides of plane 4. This holder 6 is positioned at the so-called "magic angle" relative to the bore 1 axis and can be rapidly rotated around its axis by a small air turbine. Furthermore, the probehead 5 contains the tramsmitting and receiving coils which are necessary to take NMR-spectra and possibly means to control sample temperature etc. (not shown explicitly). In addition, the probehead 5 contains an air conduit connected to the lower end of the sample holder 6 and a sample conduit 8 connected to the upper end of the sample holder 6. These conduits offer the possibility to remove a sample from the sample holder 6 via sample conduit 8 by introducing an air jet into air conduit 7. Alternatively a sample introduced into sample conduit 8 can be lowered down into the sample holder 6 by properly reducing the air current. Insofar as the spectrometer with the cryomagnet 1, the shim system 3 and the probehead 5 is a standard configuration, further explanations are unnecessary.

Further details about the configuration of such spectrometers can be, in particular, obtained from the brochures of the NMR spectrometer types CXP and MSL manufactured and distributed by the applicant.

In the embodiment shown a sample magazine 11 is located in the bore 1 of the cryomagnet 2 axially above the probehead 5. The magazine 11 has a central bore 12 and inside this central bore 12 a rotatable drum 21 is situated between two plates 13, 14 which are perpendicular to the axis of the cryomagnet. The drum 21 has around its perimeter a number of bores which are parallel to the axis. Only two of these bores 15, 16 are visible in FIG. 1. Each bore is designed to house a sample, e.g. in the form of a tube which contains the substance to be measured. The drum 21 is mounted on a hollow shaft 17 which extends upwards out of cryomagnet 2 and which is equipped on its upper end with a drive mechanism 18. In the only schematically shown example of FIG. 1 the drive mechanism 18 includes a bevel gear pair and an additional shaft 19 which for example can lead to a step motor. However, a simple handle would also be possible to enable drum 21 to be turned by hand. The drum 21 could then be equipped with a locking mechanism which is able to fix it in different positions. In each case the drum can be brought into a number of positions equal to the number of bores in the drum. Each position has one of the bores facing the end 20 of sample conduit 8 located in probehead 5. The upper plate 14 has a small bore or hole 22 facing the end 20 of the sample conduit 8 which allows air to escape.

By turning drum 21, the pictured mechanism allows one of the various samples contained in bore 15, 16 to be brought into position at the end 20 of the sample conduit 8. By regulating the air flow introduced through air conduit 7, the sample located in the selected chamber 15 of drum 21 can be lowered into holder 6 of probehead 5 and examined. After taking a spectrum, the sample can be raised back into chamber 15 of drum 21 by increasing the airflow. At this time, the drum can be rotated and another one of the samples contained in the drum can be selected, lowered into sample holder 6, and examined. In this way, the samples contained in drum 21 can be examined in arbitrary sequence, and the entire process can be automated.

In order to load drum 21 with samples, it is in principal possible to design sample magazine 11 in such a way that it can be removed upward from bore 1 of the cryomagnet. Alternatively, the inner magazine could be integrated into the probehead, which itself can be removed via the bottom of the cryomagnet bore. Configurations which allow automatic loading of the inner magazine are of particular interest. In this connection, a pneumatic system similar to that used to introduce the sample from drum 21 into sample region 6 of probehead 5 could be envisioned. This pneumatic system could be implemented, for example, in combination with an automatic sample changer similar to that used in the above mentioned NMR-spectrometer type AM. Such a sample changer could, for example, have a vertically sliding shaft 31 whose end is equipped with a grasping mechanism. The sample changer can be lowered into the bore 1 of the cryomagnet 2 down to the drum 21 in order to insert a sample into the drum or to remove it from there. Pursuant to this, the shaft 31 and the grasping mechanism 32 are positioned coaxially to a bore 16 of the drum and the upper plate 14 has a corresponding notch or hole 33 at the location where shaft 31 is supposed to engage drum 21. Hole 33 could alternatively be connected to an air conduit of a corresponding pneumatic system which extends up to the top of the bore of the cryomagnet and to which the sample is transferred by the grasping mechanism.

In the configuration according to the invention, drum 21 forms a magazine in which several samples can be stored for some time in a magnetic field region of cryomagnet 2. In this region the magnetic field does not have the extremely high homogeneity required to take an NMR-spectrum but has approximately the same strength as the magnetic field in the homogeneous region. In this way it is possible to premagnetize the samples at this location while other samples are being measured and so it becomes possible to magnetize samples with long spin-lattice relaxation times T1 without blocking use of the spectrometer for measurements. A possible procedure would be to fill the magazine with samples with long T1 and to take measurements on other samples during the time required for premagnetization. Alternatively a sequential operation with measurements on samples with long relaxation times is possible. The measured samples are sequentially taken out of the drum and replaced by new ones such that the total time for taking spectra of the preceding samples is available to magnetize the sample inserted last. It is also possible to accumulate data by cyclic repetition of measurements on individual samples in order that the relaxation time pauses between the individual measurements can be used to measure other samples.

It should also be apparent that the invention is not limited to the example which is shown only schematically and which is intended to illustrate the principle features of the invention. Neither the construction details of the sample magazine nor the manner in which it is either filled or emptied including the way of sample transfer from the magazine to the sample holder and back are relevant to the invention. The only essential aspects of the invention are that a sample magazine is located within the magnetic field produced by the magnet system allowing several samples to be stored inside the magnetic field and to transfer these into the probehead after a sufficient premagnetization time, without the sample leaving the magnetic field or even suffering a change of the magnetic field which would disturb its premagnetization. Clearly, there are many ways in which the expert can apply this principle. In particular, the sample changing and individual measurement procedures can be automated and programmed in many ways. Insofar the above description provides only essential insight and stimulation to the expert for realization of the invention.

What is claimed is:

1. NMR-spectrometer apparatus comprising:
   magnet system means for producing a magnetic field which is nearly homogeneous within a specified region;
   a sample holder located in said homogeneous region of the magnetic field; and
   a sample changer comprising a sample magazine and means for transferring one sample at a time from said magazine to said sample holder and back, said sample magazine being disposed within the magnetic field at a position enabling each sample to become pre-polarized by the magnetic field, said pre-polarization being sufficient to enable each sample to take a spectrum in said magnetic field.

2. The NMR-spectrometer apparatus according to claim 1 wherein the sample magazine comprises a rotatable drum including a plurality of holders for a number of samples, said holders being disposed parallel to an axis of rotation of said rotatable drum in order that the holders can be sequentially aligned with the means for transferring one sample at a time by rotating the drum.

3. The NMR-spectrometer according to claim 1 wherein said magnet system comprises a cryomagnet, said magnetic field is disposed within a bore of the cryomagnet and the sample magazine is located in the bore of the cryomagnet at a distance from the homogeneous region of the magnetic field.

4. The NMR-spectrometer according to, claim 1 wherein the means for sample transfer includes means for transferring the samples from an outer magazine into the sample magazine located in the magnetic field.

5. The NMR-spectrometer according to claim 1 wherein the means for sample transfer includes pneumatic conduit means for carrying the sample by an air current for transfer from the sample holder to the sample magazine and vice versa by regulating the air current.

6. The NMR-spectrometer according to claim 2 wherein said magnetic system means includes a cryomagnet, said magnetic field is disposed within a bore of the cryomagnet and the sample magazine is located in the bore of the cryomagnet at a distance from the homogeneous region of the magnetic field, in order to pre-polarize samples held in said magazine, and the means for sample transfer includes means for transferring the samples from an outer magazine into the sample magazine and further includes conduit means for carrying the samples by our air current for transfer from the sample holder to the sample magazine and vice versa by regulating the air current.

* * * * *